(12) United States Patent
Goodwin et al.

(10) Patent No.: US 8,988,870 B2
(45) Date of Patent: Mar. 24, 2015

(54) DATA STORAGE DEVICE ENCLOSURE AND MODULE

(75) Inventors: Andrew Goodwin, Havant (GB); Christopher Girard, Heathrow, FL (US)

(73) Assignee: Seagate Technology LLC, Cupertino, CA (US)

( * ) Notice: Subject to any disclaimer, the term of this patent is extended or adjusted under 35 U.S.C. 154(b) by 932 days.

(21) Appl. No.: 13/169,375

(22) Filed: Jun. 27, 2011

(65) Prior Publication Data

US 2012/0327582 A1    Dec. 27, 2012

(51) Int. Cl.
*H05K 5/00*        (2006.01)
*G06F 1/18*        (2006.01)
*G11B 33/12*       (2006.01)
*H05K 7/14*        (2006.01)
*G06F 3/06*        (2006.01)

(52) U.S. Cl.
CPC .............. *G06F 1/187* (2013.01); *G11B 33/126* (2013.01); *H05K 7/1487* (2013.01); *G06F 3/0626* (2013.01); *G06F 3/0658* (2013.01); *G06F 3/0689* (2013.01)
USPC ............ 361/679.31; 361/679.32; 361/679.37; 361/679.39; 361/679.4

(58) Field of Classification Search
USPC ............... 361/679.32, 679.37–679.39, 679.4; 710/2, 104, 300–302
See application file for complete search history.

(56) References Cited

U.S. PATENT DOCUMENTS 8,248,782 B2 *   8/2012   Tanaka et al. .............. 361/679.5
2012/0243170 A1 *   9/2012   Frink et al. ............... 361/679.34

* cited by examiner

*Primary Examiner* — Robert J Hoffberg
*Assistant Examiner* — Hung Dang
(74) *Attorney, Agent, or Firm* — HolzerIPLaw, PC

(57) ABSTRACT

There is disclosed an electronics module (101) for a data storage device enclosure (100) and data storage device enclosures (100). The module comprises an enclosure connector (104) for connecting to the enclosure, at least one bay constructed and arranged to receive a data storage device (200), and a controller (102) arranged to selectively provide access to storage devices to which it is connected. The module (101) has a communications path (107) between the controller and the enclosure connector (104) by which the controller can communicate with storage devices in the enclosure. The module (101) also has a first communications path to the data storage device (200) when received in the bay by which the controller can communicate with that data storage device. The module (101) also has a second communications path to the data storage device (200) when received in the bay by which that data storage device can be accessed from outside the module.

19 Claims, 3 Drawing Sheets

DATA STORAGE DEVICE ENCLOSURE AND MODULE

The present invention relates to data storage device enclosures and to modules for data storage device enclosures.

In preferred embodiments, the present invention relates to storage enclosures for a plurality of disk drives, "redundant array of inexpensive disks" (RAID) arrays, "storage array network" (SAN) or "network attached storage" (NAS) storage, server enclosures and the like.

FIGS. 1A, 1B and 1C shows a typical prior art data storage device enclosure. The enclosure 1 is modular, having module bays 2 at the front of the enclosure 1 for receiving data storage modules 3 (e.g. disk drive assemblies mounted in carriers), and bays 4,6,8 at the rear of the enclosure for receiving various modules, such as power supply units (PSUs) 5, cooling modules 7 and various electronics modules 9 (also known as "Input/Output modules" or "I/O modules"). These electronics modules 9 typically include one or more controllers for the disk drive assemblies, providing input/output connections to the enclosure, "just a bunch of disks" (JBOD) functionality or "switched bunch of disks" (SBOD) functionality or "expanded bunch of disks" (EBOD) functionality based on "SAS expander" technology and/or RAID functionality. The electronics modules 9 may also provide enclosure management services or other functionality. The various modules 3,5,7,9 plug into a midplane 10 within the enclosure 1 via connectors. The modules 3,5,7,9 are removable from the enclosure 1 for maintenance and/or replacement. Often modules 5,9 at the rear of the enclosure 1 are provided in duplicate or more so that a certain measure of redundancy can be provided in case of failure of a module. Many other layouts and configurations of data storage enclosures 1 are possible and, indeed, available commercially.

Enclosures 1 are commonly designed to be mounted in standard 19 inch (approx. 483 mm) racks, thereby fixing their width. The height may vary. For example, the enclosure 1 may be specified as being 2U or 4U in height, the unit "U" being a standard unit for height in the field of storage enclosures equal to 1.75 inches (approx. 44 mm). As is conventional, references to "front" and "rear", "above", "below", etc, in relation to the enclosure and/or its bays are given with reference to the orientation of a conventionally mounted enclosure, i.e. one mounted laterally in a 19 inch rack. Nonetheless, these terms should also be construed accordingly to cover a situation where the enclosure is arranged so as to be turned on its side to be vertically arranged, or indeed in any orientation.

One important consideration in the manufacture of storage enclosures is the layout and positioning of the storage devices within the enclosure. It is desirable to make best use of the available space in the storage enclosure to fit in as many storage devices as possible to increase the amount of storage the enclosure can provide. However, there are various considerations balanced against this desire to fit in as many storage devices as possible. For example, it is desirable to implement redundancy so that access to data is maintained if a component of the enclosure fails. Also, the structure should preferably allow the storage devices to be easily removed from and inserted into the enclosure, possibly by "hot-swapping" the storage devices so that that the enclosure need not taken out of use while the storage device is swapped. It is also necessary to ensure that adequate cooling is provided to the storage devices to prevent overheating. This is usually implemented by providing a cooling airflow through the enclosure which cools the storage devices and/or other components of the enclosure. The arrangement should also therefore allow adequate airflow between the storage devices.

According to a first aspect of the present invention, there is provided an electronics module for a data storage device enclosure, the electronics module comprising: an enclosure connector for connecting the electronics module to the enclosure; at least one bay in the electronics module constructed and arranged to receive a data storage device; a controller arranged to selectively provide access to storage devices to which the controller is connected; a communications path between the controller and the enclosure connector by which the controller can communicate with storage devices in the enclosure; a first communications path to the data storage device when received in the at least one bay by which the controller can communicate with that data storage device; and, a second communications path to the data storage device when received in the at least one bay by which that data storage device can be accessed from outside the module.

This allows increased density of storage devices in an enclosure by housing additional storage devices in the electronics modules, in addition to whatever other storage devices are received in the enclosure. The additional storage devices have two access paths being firstly connected to the controller in the same electronics module as the additional storage device, and secondly having an externally available communication path by which they can be connected to for example the controller of another electronics module. Thus the additional storage is highly available due to the dual path access to said individual storage devices.

Preferably the electronics module contains two or more storage devices. The storage devices may be rotational disk drive units, or solid state drive units in embodiments, or other types of storage, or a combination thereof. The storage enclosure is preferably of a modular type having a plurality of bays for receiving data storage devices optionally in carriers, and modules such as power supply units, temperature control units and at least one electronics module. The enclosure connector can be one connector or several individual connectors.

Preferably, the second communications path can be accessed by the enclosure connector. This provides a convenient way of connecting the additional storage of one electronics module to another electronics module. Preferably, where the enclosure is of the type which has a midplane, the external connector is provided by a midplane connector. This also allows existing links on the midplane to be used for this communication. However, in other embodiments, a different connection can be used.

In an embodiment, the electronics module has an external connector for accessing the second communications path. This allows an external cable to be used to connect together the electronics module with another electronics module to complete a communications path between the storage device in the bay of the module with the controller in the other module, thereby allowing dual path access to the storage device and redundancy in the event of failure of a module.

Preferably, the module comprises a bay connector for connecting to the storage device when received in the bay. This allows storage devices to be conveniently swapped in and out of the bay. Preferably, the at least one storage device is removable from the electronics module without removing the electronics module from the storage enclosure. This allows devices to be swapped without disrupting the operation of the electronics module. For example, the storage devices can be accessible via the rear face of the electronics module so as to be accessible at the rear of a storage enclosure when the module is received in the storage enclosure. Preferably, the at least one storage device is hot-pluggable to the electronics module. This allows devices to be swapped without disrupting the access to other device in the storage array.

In embodiments, the controller is arranged to organise the storage devices to which it is connected as one of i) a "Just a Bunch of Disks" (JBOD), ii) a "Switched Bunch of Disks" (SBOD), iii) using Serial Attached SCSI Expanders, and iv) a "Redundant Array of Inexpensive Disks" (RAID) array.

According to a second aspect of the present invention, there is provided a storage enclosure comprising: first and second electronics modules received in the storage enclosure; and, an array of data storage devices received in the enclosure, wherein each electronics module comprises: an enclosure connector by which it is connected to the enclosure; at least one bay in which is received a data storage device; and, a controller having a communications path to the enclosure connector by which it can communicate with storage devices in the array and having a communications path to the data storage device in the bay; and, a communications path between the controller in the electronics module and the storage device in the bay in the other electronics module, wherein for each electronics module, the controller is arranged to selectively provide access to the storage devices in the array, in its bay and in the bay in the other electronics module.

The electronics modules used with this aspect may be according to any of the embodiments described above.

In a preferred embodiment, the communications path between the controller in one of the electronics modules and a storage device in the bay in the other electronics module can utilise an existing pathway on the midplane intended for use as a communications path between RAID modules.

Embodiments of the present invention will now be described by way of example with reference to the accompanying drawings, in which.

Figures 1A, 1B, 1C:
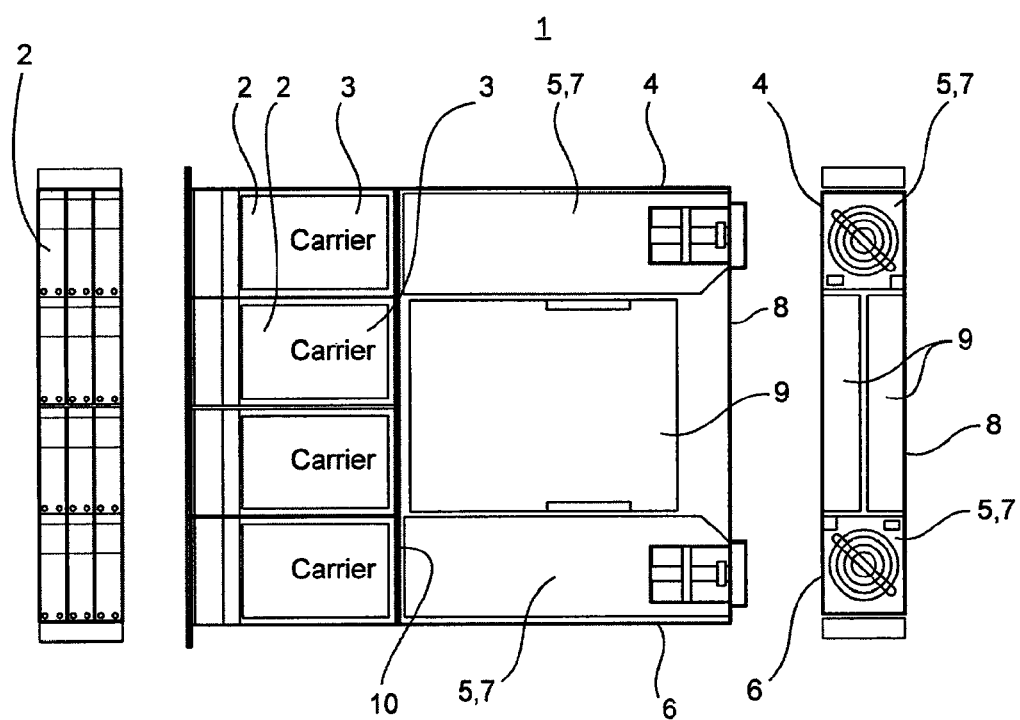
FIGS. 1A, 1B and 1C show an example of a prior art storage enclosure from the front, from above and from the rear respectively.
Figure 2:
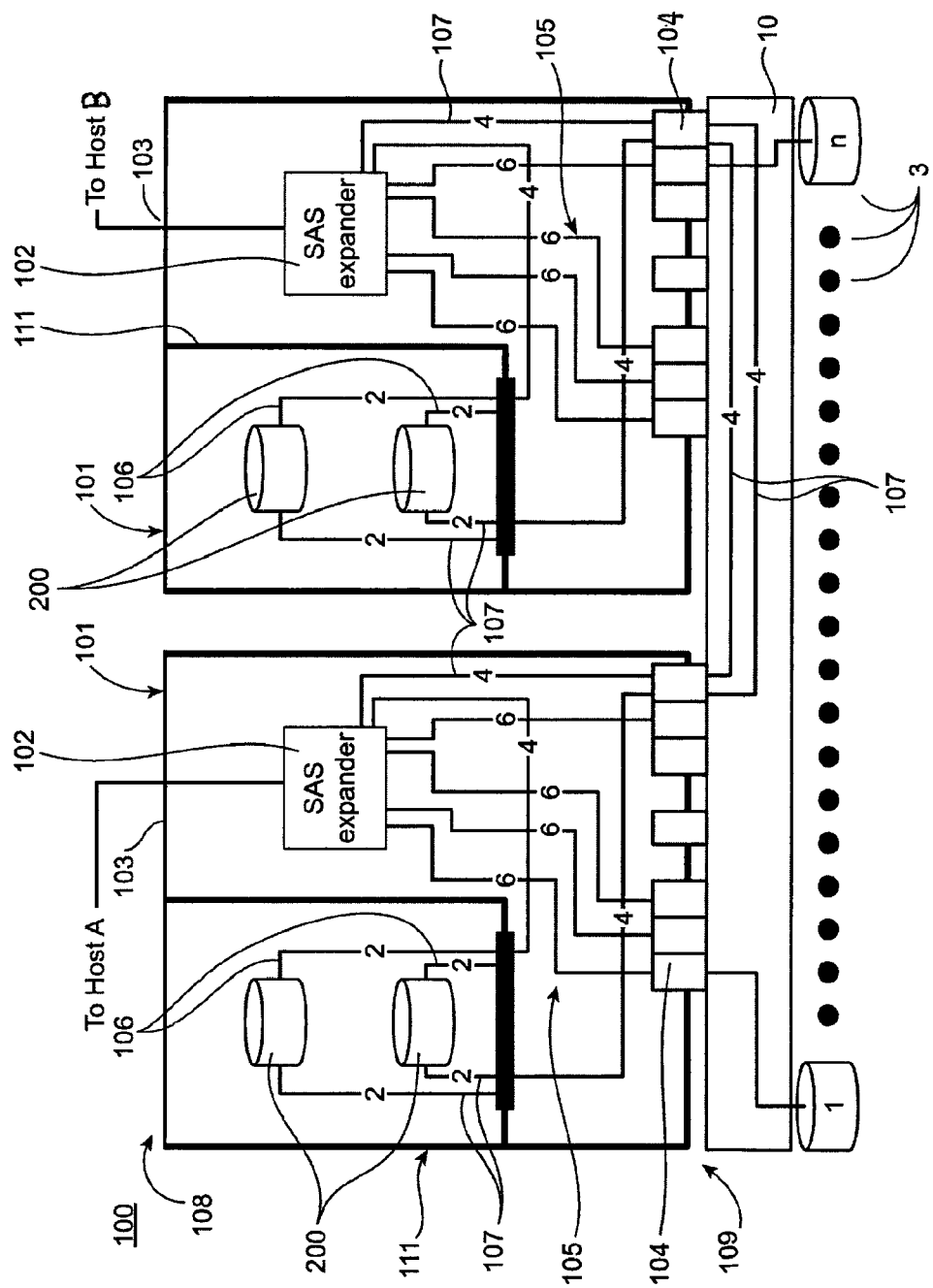
FIG. 2 shows schematically examples of electronics modules in a storage enclosure according to an embodiment of the present invention; and, FIG. 3 shows a perspective view of the electronics module of FIG. 2.

FIG. 2 shows schematically elements of a storage enclosure 100. The enclosure 100 may have a layout similar to enclosure shown by FIG. 1, having a plurality of mass storage devices 3 in carriers 4 at the front of the enclosure 100 and power supply units, cooling units, and electronics modules at the rear of the enclosure. However, as will be appreciated in the light of the following disclosure, in principle many layouts for the storage enclosure can be used. FIG. 2 shows the relationship between the storage devices 3 in the front of the enclosure 100 and the electronics modules 101 at the rear of the enclosure 100, and the communications between them via the midplane 10. For clarity FIG. 2 omits showing other elements of the storage enclosure 100, such as power supply units and the physical chassis of the enclosure 100.

The storage enclosure 100 of the present example has [1 . . . n] storage devices 3 in the front of the enclosure 100 and two electronics modules 101 at the rear 108 of the enclosure 100. Each electronics module 101 contains a controller 102 for implementing particular functionality for the storage enclosure 100, i.e. to provide a controller for controlling access to and the organisation of the storage devices in the enclosure 100. The electronics module 101 may organise the storage devices as a JBOD (just a bunch of disks) or a SBOD (switched bunch of disks), using for example Fibre Channel or PCIe based protocols, or a EBOD (expanded bunch of disks), using for example Serial Attached SCSI (SAS) or SAS Expanders, and/or as a RAID array (redundant array of inexpensive disks). The layout of the electronics modules 101 may be designed in conjunction with the Storage Bridge Bay specification (SBS 2.0). However, the principles of the present invention can be applied to any custom designed electronics module.

In the present example, the controller 102 comprises a SAS (Serial Attached SCSI) expander as known in the art per se to provide an EBOD. The SAS expanders 102 connect to hosts Host A and Host B via respective host connectors 103 at the rear 108 of the electronics modules 101. The front 109 of each electronics module 101 has a connector for connecting to the enclosure, i.e. a midplane connector 104 in this example where the enclosure has a midplane 10 to distribute signals between components of the enclosure 100. For each module 101, the controller 102 has a communications path 105 (which may comprise one or more pathways in practice) to the midplane connector 104 (which may comprise one or more discrete connectors in practice) and thus to the midplane 10 and the storage devices 3 in the front of the enclosure 100. In this example, the connections from the controller 102 to the midplane 10 are based around the SBB 2.0 specification, but in practice this can be any kind of connecter system required for the enclosure 100.

The SAS expanders 102 thus allow the hosts Host A, Host B to access the storage devices 3 in the front of the enclosure 100. Each SAS expander 102 can access each storage device 3 in the front of the enclosure 100 in order to provide dual path access to the storage devices 3 and so provide redundancy and high availability of data. This is maintained so that if one host, electronics module 101 or power supply unit fails then the data located on the mass storage devices 3 can still be accessed by at least one host while the storage enclosure 100 is serviced to replace the failed part.

Each electronics module 101 contains two additional mass storage devices 200 received in bays 111. For each electronics module 101, each additional storage device 200 has a communication path 106 to the SAS expander 102 for that module 101. Each storage device 200 also has a second communication path 107 via the midplane connectors 104 and the midplane 10 to the SAS expander 102 in the other electronics module 101. The connections are preferably according to the SBB 2.0 standard. Thus, each additional storage device 200 can be accessed by both SAS expanders 102 and thus by both hosts HOST A, HOST B. This dual path access to the individual mass storage devices 200 housed within the electronics modules 101 ensures highly available access to the mass storage devices 200 at all times, even if the controller 102 in the electronics module 101 in which the mass storage devices 200 are housed itself fails, for whatever reason.

Figure 3:
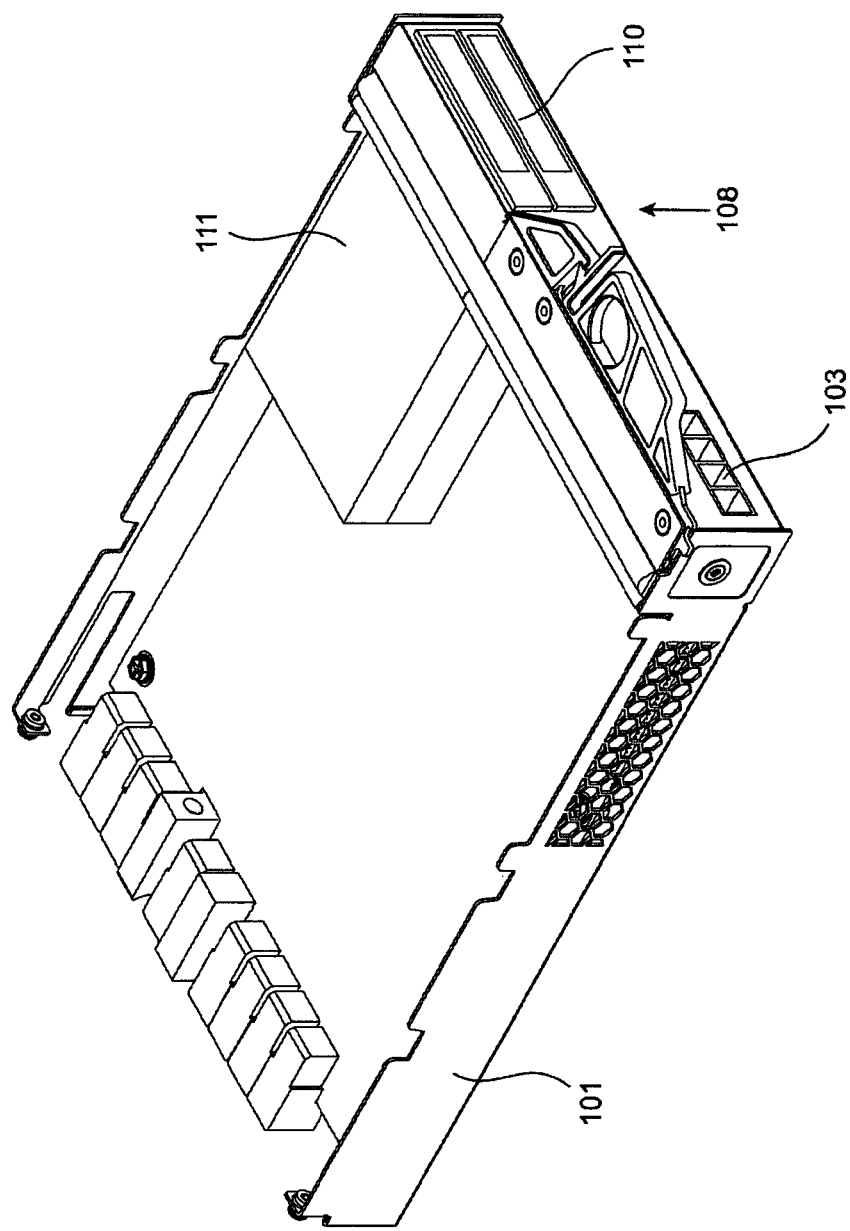

FIG. 3 shows the rear 108 of an electronics module 101. The rear face 108 has four ganged mini-SAS HD connectors 103 to provide connection to the respective host. The rear face 108 also has a RJ45/USB and a 3.5 mm jack for providing maintenance and other communications with the storage enclosure 100, for example downloading system logs, uploading new firmware to the electronics inside the electronics module, and general communication with the electronics inside the electronics module. The rear face 108 also has access doors 110 by which bays 111 can be accessed and by which the storage devices 200 will be physically individually accessible while the electronics module 101 is still inserted into the storage enclosure 100. Preferably the mass storage devices 200 are "hot pluggable" to the modules 101 so they can be removed and replaced without disrupting communications between the hosts and other storage devices 3,200 housed within the enclosure. The requirements for being "hot pluggable" are a function of there being access to the storage devices to allow their removal/insertion while the enclosure is still running/active, the connector for connecting to the storage devices being suitable and the protocols used for communicating with the storage devices being suitable. Also the host has to be able to handle the disappearance and reappearance of drives without warning.

In a preferred embodiment, existing high speed links 107 on the midplane 10 may be used for the communication path between the additional storage device 200 in one electronics module 101 and the other electronics module 101. For example, many enclosures can accept a variety of electronics modules to supply particular organisation of the storage devices. The midplane 10 may therefore have links that are normally used for communication between RAID modules type electronics modules 101 for cache coherency checking and failover. The EBOD electronics modules 101 used in the present example that will house the mass storage devices 200 do not use these high speed inter module links for anything, so these links can be utilised for communications between the individual modules 101 and the mass storage devices 103 housed in each one.

Alternatively additional cabling, either internal or external to the enclosure 100, can be provided between the electronics modules 101 to allow for this data flow. For example, the electronics modules 101 can have an external connector, separate from the midplane connector 104, which can be used to connect together the electronics modules and form a communications path between the additional storage devices 200 in the bays 111 and the controller 102 in the other module.

It is known per se to provide a cooling air flow through the enclosure to cool the electronic components in the enclosure. Typically, the cooling airflow is drawn in at the front of the enclosure past the storage devices 3 in the front of the enclosure, flows through apertures in the midplane and through the power supplies and electronics modules in the rear of the enclosure. The enclosure may have dedicated cooling, i.e. fan, modules in the rear of the enclosure and/or the power supplies and/or the electronics modules may have air movement devices to draw air through the enclosure.

In embodiments of the present invention, in whichever way the airflow is implemented, the airflow may be used to provide cooling to the additional storage devices 200 in the electronics modules 101 by causing air to flow past the storage devices. Additional fans and/or baffles may be provided to divert the airflow as appropriate.

The mass storage devices 3,200 either in the front of the enclosure 100 or the additional storage in the electronics modules 101 may be rotating Hard Disk Drives (HDDs) to provide mass storage devices, Solid State Drives (SSDs), or potentially other suitable storage devices. SSDs may be preferred for the additional storage in applications because they are less susceptible to interference from the power supply units and require little or no vibration damping compared with a rotational HDD.

Thus, the preferred embodiments of the invention allow increased density of storage devices in a storage array in an enclosure by housing these in the electronics modules 101 at the rear of the enclosure 100. At the same time, the additional storage 200 is highly available due to the individual accessible hot pluggable mass storage devices 200 housed within electronics modules 101 and the dual path access to said individual mass storage devices 200.

Some prior art electronics modules for storage enclosures may have basic storage contained therein. However, this additional storage is not part of the storage array in these enclosures. In these enclosures the modules containing the additional storage are connected to a primary module and operate as slave modules to the primary electronics module. The mass storage devices within the slave module can only be accessed by the primary module. If the primary module fails, then the data within the slave module can no longer be accessed. The arrangement is also not suited to "hot plugging" of the additional disk drives. Thus, this additional storage does not have a dual path allowing other hosts/modules to access the storage if the electronics controller in the module containing the storage fails.

In other prior art, the electronics modules may have storage acting as a boot device for the electronics modules. This storage is not part of the storage array as such. Any information stored by this storage, e.g. system logs etc., belongs to a single host and cannot be accessed by the other host in the system.

Embodiments of the present invention have been described with particular reference to the examples illustrated. However, it will be appreciated that variations and modifications may be made to the examples described within the scope of the present invention. For example, the electronics modules are not limited to using SAS based protocols, but can use instead Fibre Channel or PCIe protocols or indeed any other suitable protocol desired for accessing the storage array.

The invention claimed is:

1. An electronics module for a data storage device enclosure, the electronics module comprising:
   an enclosure connector for connecting the electronics module to the enclosure;
   a controller arranged to selectively provide access to data storage devices to which the controller is connected:
   at least one bay in the electronics module constructed and arranged to receive at least one data storage device of the data storage devices;
   a first communications path to the at least one data storage device when received in the at least one bay by which the controller can communicate with the at least one datastorage device;
   a second communications path to the data storage device when received in the at least one bay by which the at least one data storage device can be accessed from outside the module; and,
   a third communications path between the controller and the enclosure connector by which the controller can communicate with the data storage devices in the enclosure other than the at least one data storage device received in the at least one bay.

2. An electronics module according to claim 1, wherein the second communications path can be accessed by the enclosure connector.

3. An electronics module according to claim 1, wherein the enclosure connector is a midplane connector for connecting to a midplane of the storage enclosure.

4. An electronics module according to claim 1, wherein the electronics module has an external connector for accessing the second communications path.

5. An electronics module according to claim 1, comprising a bay connector for connecting to the storage device when received in the bay.

6. An electronics module according to claim 5, wherein the bay is constructed and arranged such that the at least one storage device is removable from the bay without removing the electronics module from the storage enclosure.

7. An electronics module according to claim 6, wherein the at least one storage device is hot-pluggable to the bay.

8. An electronics module according to claim 1, comprising a host connector for connecting to a host, and a fourth communications path between the host connector and the controller, the controller being arranged to provide access to the storage devices from a host connected in use to the host connector.

9. An electronics module according to claim 1, wherein the controller is arranged to organise the storage devices to which it is connected as one of
   i) a "Just a Bunch of Disks" (JBOD),
   ii) a "Switched Bunch of Disks" (SBOD),
   iii) using Serial Attached SCSI Expanders, and
   iv) a "Redundant Array of Inexpensive Disks" (RAID) array.

10. A storage enclosure comprising:
    first and second electronics modules received in the storage enclosure; and an array of data storage devices received in the enclosure, wherein each electronics module comprises:
    an enclosure connector by which it is connected to the enclosure;
    at least one bay in which is received at least one data storage device of the array of data storage devices; and
    a controller having a first communications path to the at least one data storage device in the bay; and
        a second communications path between the controller in each electronics module and the at least one data storage device in the bay in another electronics module of the first and second electronics modules,
    the controller having a third communications path to the enclosure connector by which the controller can communicate with data storage devices in the array,
    wherein for each electronics module, the controller is arranged to selectively provide access to the array of data storage devices including the at least one data storage device in the bay of the first electronic module and the at least one data storage device in the bay of the second electronic module.

11. A storage enclosure according to claim 10, wherein the second communications path between the controller in one electronics module of the first and second electronics modules and the at least one data storage device in another electronics module of the first and second electronics modules includes the enclosure connector of the first and second electronics modules.

12. A storage enclosure according to claim 10, comprising a midplane and wherein the enclosure connector is a midplane connector for connecting the modules to the midplane.

13. A storage enclosure according to claim 10, wherein the second communications path between the controller in one electronics module of the first and second electronics modules and the at least one data storage device in another electronics module of the first and second electronics modules includes external connectors and a cable between the first and second electronics modules.

14. A storage enclosure according to claim 10, wherein at least one of the first and second electronics modules comprises a bay connector for connecting to the at least one data storage device in the bay of the at least one of the first and second electronics modules.

15. A storage enclosure according to claim 14, wherein the bay is constructed and arranged such that the at least one storage device is removable from the bay without removing the electronics module from the storage enclosure.

16. A storage enclosure according to claim 15, wherein the at least one storage device is hot-pluggable to the bay.

17. A storage enclosure according to claim 10, comprising a host connector for connecting to a host, and a fourth communications path between the host connector and the controller of an electronics module, the controller being arranged to provide access to the storage devices from a host connected in use to the host connector.

18. A storage enclosure according to claim 10, wherein the controller of at least one electronics module is arranged to organise the storage devices to which it is connected as one of a JBOD, a SBOD, an EBOD and a RAID array.

19. A storage enclosure according to claim 12, wherein the second communications path between the controller in one electronics module of the first and second electronics modules and the at least one data storage device in the bay in another electronics module of the first and second electronics modules can utilize an existing pathway on the midplane intended for use as a communications path between RAID modules.

* * * * *